(12) United States Patent
Kolowich

(10) Patent No.: US 7,934,537 B2
(45) Date of Patent: May 3, 2011

(54) THERMAL RECEPTACLE WITH PHASE CHANGE MATERIAL

(76) Inventor: J. Bruce Kolowich, Saline, MI (US)

( * ) Notice: Subject to any disclaimer, the term of this patent is extended or adjusted under 35 U.S.C. 154(b) by 0 days.

(21) Appl. No.: 11/452,569

(22) Filed: Jun. 14, 2006

(65) Prior Publication Data

US 2007/0144703 A1   Jun. 28, 2007

Related U.S. Application Data

(63) Continuation of application No. 11/258,703, filed on Oct. 26, 2005, now Pat. No. 7,059,387, which is a continuation of application No. 10/690,098, filed on Oct. 21, 2003, now Pat. No. 6,968,888, which is a continuation of application No. 09/055,377, filed on Apr. 6, 1998, now Pat. No. 6,634,417.

(60) Provisional application No. 60/043,431, filed on Apr. 7, 1997.

(51) Int. Cl.
*F28F 13/00* (2006.01)
(52) U.S. Cl. .......... 165/10; 165/136; 165/902; 215/13.1
(58) Field of Classification Search .................. 165/10, 165/135, 136, 902, 918; 62/457.3, 451, 457.4; 215/382, 13.1, 12.1, DIG. 7; 219/430, 432, 219/433, 439; 220/421, 426, 446, 469, 658, 220/659

See application file for complete search history.

(56) References Cited

U.S. PATENT DOCUMENTS

| | | | |
|---|---|---|---|
| 1,182,042 A | 5/1916 | Rubin | |
| 1,679,621 A | 8/1928 | Myers | |
| 1,721,311 A | 7/1929 | Muenchen | |
| 2,761,580 A | 9/1956 | Tamboles | |
| 2,808,167 A | 10/1957 | Polazzolo | |
| 2,828,043 A | 3/1958 | Hosford, Jr. | |
| 2,863,037 A | 12/1958 | Johnstone | |
| 3,096,897 A | 7/1963 | Hanson | |
| 3,205,677 A | 9/1965 | Stoner | |
| 3,302,428 A | 2/1967 | Stoner et al. | |
| 3,360,957 A | 1/1968 | Paquin | |
| 3,463,140 A * | 8/1969 | Rollor, Jr. .................... | 126/246 |
| 3,521,788 A | 7/1970 | Kandol et al. | |
| 3,603,106 A * | 9/1971 | Ryan et al. ................... | 62/457.4 |
| 3,725,645 A | 4/1973 | Shevlin | |
| 3,766,975 A | 10/1973 | Todd | |
| 3,807,194 A | 4/1974 | Bond | |
| 3,830,148 A | 8/1974 | Shevlin | |
| 3,910,441 A | 10/1975 | Bramming | |
| 3,961,720 A | 6/1976 | Potter, Jr. | |
| 4,184,601 A | 1/1980 | Stewart et al. | |
| 4,528,439 A | 7/1985 | Marney, Jr. et al. | |
| 4,746,028 A | 5/1988 | Bagg | |
| 4,782,670 A * | 11/1988 | Long et al. .................. | 62/457.4 |
| 4,932,225 A | 6/1990 | Bighouse | |

(Continued)

*Primary Examiner* — Teresa J Walberg
(74) *Attorney, Agent, or Firm* — Gifford, Krass, Sprinkle, Anderson & Citkowski, P.C.; Douglas L. Wathen

(57) ABSTRACT

A liquid receptacle for rapidly lowering the temperature of a liquid contained therein to a warm range suitable for human contact and maintaining the liquid in the warm range for an extended period of time includes an inner vessel with an open upper end and a closed lower end and a wall connecting the upper and lower end. An insulated outer shell is spaced from the inner vessel to define an interstitial chamber between the inner vessel and the outer shell. A phase change material occupies the chamber and regeneratively absorbs thermal energy from the liquid to cool the liquid and then releases the thermal energy back to the liquid to maintain the temperature of the liquid.

11 Claims, 4 Drawing Sheets

U.S. PATENT DOCUMENTS

| | | | | |
|---|---|---|---|---|
| 5,076,463 A | * | 12/1991 | McGraw | 220/592.17 |
| 5,090,213 A | * | 2/1992 | Glassman | 62/457.3 |
| 5,269,368 A | | 12/1993 | Schneider et al. | |
| 5,406,808 A | | 4/1995 | Babb et al. | |
| 5,573,141 A | * | 11/1996 | Chen | 62/457.3 |
| 6,000,565 A | | 12/1999 | Ibeagwa | |
| 6,634,417 B1 | * | 10/2003 | Kolowich | 165/10 |
| 6,968,888 B2 | * | 11/2005 | Kolowich | 165/10 |

* cited by examiner

THERMAL RECEPTACLE WITH PHASE CHANGE MATERIAL

RELATED APPLICATION

This application is a continuation of U.S. patent application Ser. No. 11/258,703, filed Oct. 26, 2005, which is a continuation of U.S. patent application Ser. No. 10/690,098, filed Oct. 21, 2003, now U.S. Pat. No. 6,968,888, which is a continuation of U.S. patent application Ser. No. 09/055,377, filed Apr. 6, 1998, now U.S. Pat. No. 6,634,417, which claims priority from provisional patent application Ser. No. 60/043,431 filed Apr. 7, 1997, the entire content of all of which is incorporated herein by reference.

TECHNICAL FIELD

The subject invention relates generally to liquid receptacles or containers and more specifically to a receptacle that rapidly cools a hot liquid to a warm range and then maintains the fluid in the warm range for an extended period.

BACKGROUND OF THE INVENTION

There have been many attempts in the past to maintain liquids and solids within certain temperature ranges. Hot beverages are usually prepared and served at temperatures well above the temperature at which consumers prefer to drink them. Typically, the consumer must wait an extended period for the beverage to sufficiently cool before drinking it. Some impatient consumers will attempt to drink the beverage too soon resulting in burns to the mouth. Similarly, if the drink is spilled before it has had sufficient time to cool, burns to the skin may result. Therefore, it is desirable to rapidly cool the beverage from the temperature at which it is served to an acceptable drinking range. Once the beverage is within the acceptable drinking temperature range, it is desirable to maintain the temperature of the beverage within this range for an extended period of time.

Many approaches have been tried for both rapidly cooling a hot beverage and for maintaining the temperature of the beverage within an acceptable drinking temperature range. To rapidly cool a hot beverage, ice or a cool liquid (e.g., water or milk) can be added to the hot beverage. This approach rapidly cools the beverage but dilutes the hot beverage. This is frequently undesirable. This approach is often inconvenient and imprecise; if the person adds too little or too much, the temperature of the hot beverage will be higher or lower than desired and may require further attention. Finally, this approach does not provide any assistance in maintaining the temperature of the hot beverage in the acceptable drinking temperature range. Once the beverage reaches an acceptable temperature, it will continue to lose thermal energy to its surroundings. This results in the beverage becoming cool too quickly. Therefore, the beverage remains within an acceptable drinking temperature range for only a short period.

A hot beverage can also be cooled by pouring it into a cool container. Thermal energy is transferred from the hot beverage to the cool container thereby warming the container and cooling the beverage. This approach suffers from some of the same limitations as adding cool liquid or ice. If the cup is too cool or too warm or has too much or too little thermal mass, the beverage will stabilize at the wrong temperature. Also, while a heavy container will slow the rate of cooling somewhat due to the increase in the total thermal mass of the system, the effect will be small and the beverage will only remain in the ideal drinking range for a short period.

Up to this time, the primary method employed for slowing the cooling rate of a beverage was to insulate the container. Everything from simple foam cups to expensive and sophisticated vacuum mugs is used. These approaches slow the cooling rate of the beverage. However, the ability of the insulated mugs currently on the market to maintain beverage temperatures is relatively limited. Even the best mugs usually keep liquids warm for less than 45 minutes. Stainless, vacuum insulated mugs are best at maintaining temperature, but no product currently exists which can passively cool a hot beverage quickly. Also, the beverage in an insulated container will continue to cool despite the insulation. The cooling rate will only be slowed. Insulation does not provide a way to add thermal energy back to the beverage.

To maintain the temperature of a beverage as it cools, the prior art has taught the use of an electric heater. At least one manufacturer produces a portable refrigerator/heater which plugs into a car's cigarette lighter and may be used to cool or warm beverages. Likewise, plug-in mugs, hot plates and immersion devices may be used to keep beverages warm. Some beverage containers are available that plug into accessory plugs in automobiles. A container may also be periodically microwaved to reheat the contents. All of theses approaches suffer from lack of portability and dependence on outside energy sources. They also fail to address the need to rapidly cool a beverage to an acceptable drinking temperature range.

The demand for hot beverages is very high, especially for coffee and tea, the most popular adult hot beverages. In 1990, approximately 42% of the US population consumed coffee and 30% consumed tea. The number of occasions that hot beverages are consumed away from home has increased significantly in recent years. By 1999, the Specialty Coffee Association of America predicts that there will be approximately 10,000 coffee cafes in comparison to the approximately 3,000 in 1996. The Association forecasts that of the $1.5 billion in sales coffee cafes will ring up in 1999, 20% will be from hot beverage take out.

Therefore, it is desirable to develop a reusable beverage container that will rapidly cool a beverage to an acceptable drinking temperature, will maintain the temperature within an acceptable temperature range for an extended period, requires neither manipulation by the consumer or the input of external energy, and is portable.

Another related application requiring temperature regulation is baby bottles. Beverages given to infants usually must be warmed but it is important to not give an infant a beverage that is too hot. Infants cannot tolerate temperatures as high as adults and parents must learn to determine the maximum acceptable temperature for their child. Therefore, when a beverage is warmed for an infant, it may be necessary to cool it rapidly back to an acceptable temperature. If the beverage is too warm, a parent typically must add cool liquid or allow time to pass. Also, if the infant is fussy and does not drink the entire contents of the bottle immediately, the contents may cool to the point that the infant will not drink it. Then the parent must reheat the bottle being careful to not overheat it. Insulated baby bottles are available which extend the time the contents are acceptably warm but they fail to add thermal energy back to the bottle contents. Therefore, it is desirable to develop a baby bottle that will rapidly reduce the temperature of a beverage to a safe drinking temperature for an infant and then will maintain that temperature for an extended period.

Another application where it is desirable to regulate the temperature of a liquid is in bathing tubs. When a person takes a bath or soaks in a tub, the water must be within a certain range to be comfortable. If the water is too hot, the person may be unable to enter the water or may be injured by it. This is especially important with infants and small children. If the water is too hot, cold water must be added until the temperature falls in an acceptable range. Once the water is at an acceptable temperature, it is desirable to maintain its temperature for the period of the bath. If a person wishes to soak or a child wishes to play in the tub for a period of time, the water may become uncomfortable due to its falling temperature. Then, additional hot water must be added to raise the temperature back into the acceptable range. Insulated bathing tubs are available which help reduce the rate of temperature loss but do not address the issue of water that is too hot. They also fail to add thermal energy back into the tub. Some whirlpool tubs include heaters for maintaining the temperature of the water but these devices are expensive to purchase and operate, require a complex system of pumps, valves and switches, and are noisy in operation. They also fail to address the issue of water that is too hot. Therefore, it is desirable to develop a bathing tub that would rapidly reduce the temperature of water to an acceptable bathing range and then to maintain the temperature of the water within the acceptable range for an extended period.

SUMMARY OF THE INVENTION

This invention addresses the need to rapidly lower the temperature of a liquid to a warm range suitable for human contact and then maintain the liquid in the warm range for an extended period of time. The invention comprises a liquid receptacle having a side wall with a lower end and an open upper end. A bottom wall closes off the lower end of the side wall. The side wall has an inner surface and a spaced outer surface. An interstitial chamber is defined by the space between the inner and outer surfaces. An insulation layer is disposed at least partially between the chamber and the outer surface of the receptacle. A phase change material at least partially fills the chamber. The phase change material regeneratively absorbs thermal energy from a hot liquid in the receptacle thereby rapidly lowering the temperature of the liquid and then the material releases the thermal energy back to the liquid to maintain the temperature of the liquid.

The present invention is suitable for any application requiring the rapid lowering of the temperature of a liquid in a container and then the maintenance of the temperature of the liquid for an extended period of time. Among other things, the invention can be applied to drinking mugs or cups, baby bottles, carafes, and bathing tubs.

DESCRIPTION OF THE PREFERRED EMBODIMENT

Figure 1:
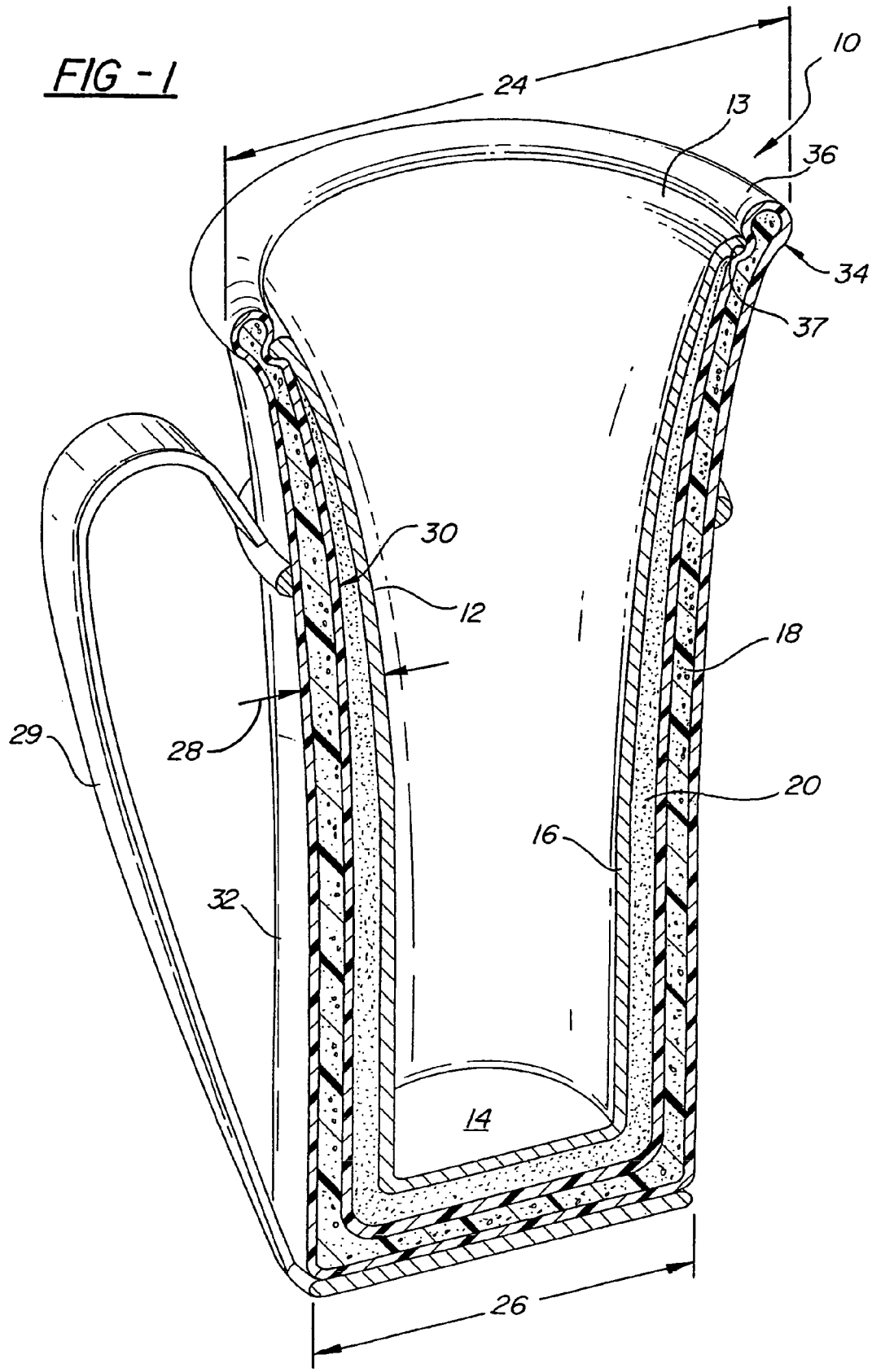
FIG. 1 is a cross sectional view of a drinking receptacle according to the present invention.

Referring to the Figures, wherein like numerals indicate like or corresponding parts throughout the several views, a liquid receptacle is generally indicated at 10. The receptacle 10 includes a inner vessel 12 with an open upper end 13 and a closed lower end 14 and a wall 16 connecting the upper 13 and lower 14 ends. An insulated outer shell 18 is spaced from the inner vessel 12 defining an interstitial chamber 20 therebetween. Phase change material is disposed within the chamber 20.

Preferably, the inner vessel 12 is either wholly or partially formed of a material having a high thermal conductivity such as aluminum, copper or alloys thereof. Pure aluminum has a thermal conductivity of 237 Watts/meter-degree Kelvin when measured at 300 degrees Kelvin. Most aluminum alloys have a thermal conductivity above 150 Watts/meter-degree Kelvin. Pure copper has a thermal conductivity of 401 Watts/meter-degree Kelvin. Most alloys of copper have thermal conductivities significantly lower than pure copper. It is most preferred that inner vessel be formed from a material having a thermal conductivity above 150 Watts/meter-degree Kelvin. As should be obvious to one skilled in the art, other materials, including gold and silver, meet this requirement. A material with a lower thermal conductivity may also be used but the performance of the invention will be reduced accordingly. The inner vessel 12 may be coated, anodized, or plated in order to improve the appearance, resistance to oxidation, or cleanability of the vessel 12. Alternatively, the vessel 12 may be formed from 2 or more different materials. The closed lower end 14 could be formed from plastic while the wall 16 is formed from coated aluminum. A two material inner vessel 12 may be beneficial for cost, manufacturing, or appearance reasons.

One embodiment of the thermal receptacle 10 has an upper rim outside diameter 24 of about 3.5", and a bottom outside diameter 26 of about 2.75". The bottom diameter 26 is small enough for the receptacle 10 to fit into typical vehicle drink holders. Total wall thickness 28 varies from a maximum of about ⅝" to a minimum of about ⅜" at the uppermost portion. The receptacle 10 may include a removable lid which selectively closes off the upper end 13 of the inner vessel 12. Alternatively, the lid could sit higher and close off the top of the thermal receptacle 10. The receptacle 10 also includes a plastic removable handle 29. The handle 29 can be removed allowing use of the receptacle 10 in vehicle drink holders.

To use the receptacle 10, a consumer removes the lid and pours a hot beverage or liquid into the inner vessel 12 of the receptacle 10, which is initially at room temperature. Because the inner vessel 12 is formed of a thermally conductive material, the chamber 20 is in thermally conductive communication with the beverage or liquid in the inner vessel 12. The thermally conductive material of the inner vessel 12 begins conducting the thermal energy of the hot beverage or liquid into the chamber 20 where it is absorbed by the phase change material. As the phase change material absorbs the thermal energy, the temperature of the phase change material rises from room temperature to its phase change temperature. Preferably the phase change material will change phases in the range of 110-160 degrees Fahrenheit (the phase change temperature). Most preferably, the phase change temperature will be in the range of 140-155 degrees Fahrenheit if the receptacle is to be used by adults. Preferably, the phase change will be from solid to liquid; a melting. One acceptable phase change material is palmitic acid. Many other phase change materials are also available with acceptable phase change temperatures. One class of phase change materials includes a set of naturally occurring fatty acids (soaps) with melting points in the range of 110° F. to 160° F. These materials are advantageous due to their non-toxic and relatively innocuous characteristics. The performance of these materials is enhanced if they are of relatively high purity (95% or better). Examples are stearic, palmitic, and myristic acids. Other possibilities for the phase change material include heavy alcohols, such as cetyl alcohol. As will be clear to one of skill in the art, many materials are available which can be used as phase change materials. However, to be useful for thermal management, a material must change phases at a temperature close to the temperature range desired to be maintained. Also, it is desirable that the material be non-toxic and be readily available at a reasonable price.

Once the phase change material reaches its melting point, the temperature of the phase change material will no longer rise as the thermal energy is absorbed causing the material to melt (change phases). As the phase change material absorbs thermal energy from the hot beverage, the temperature of the hot beverage will fall. The temperature of the hot beverage will continue to fall until the beverage and the phase change material are in thermal equilibrium; e.g., they are at the same temperature. The quantity of the phase change material is chosen so that during its phase change it can absorb enough thermal energy to cool the hot beverage from the boiling point of water down to within a warm range acceptable for human consumption. Once the hot beverage is cooled to within the warm range, the beverage and the phase change material are at equilibrium and the beverage is drinkable. As the beverage loses thermal energy to the surrounding atmosphere, its temperature will begin to fall below the phase change temperature of the phase change material. At this point, the phase change material will begin to transfer thermal energy back through the inner vessel 12 into the beverage. This thermal energy will maintain the temperature of the hot beverage near the phase change temperature of the phase change material as the phase change material resolidifies. Once the phase change material converts back to the solid phase, its temperature will begin to fall and the beverage temperature will no longer be maintained. Because the phase change material remains at the phase change temperature during the phase change, the beverage will be maintained near the phase change temperature for an extended period.

The warm range acceptable for human contact or consumption varies depending on the application. For adults, the warm range acceptable for consumption of a hot beverage is approximately 120 degrees Fahrenheit to approximately 154 degrees Fahrenheit. Above 154 degrees, hot beverages are too hot for most consumers. Most consumers prefer to start drinking a hot beverage at around 145 degrees Fahrenheit. Below 120 degrees, most consumers find that a beverage has become too cool to be palatable. Obviously, preferences vary so receptacles 10 can be manufactured with a variety of phase change materials to tailor the warm range achieved. Also, a receptacle designed for children's beverages requires a lower warm range and therefore a phase change material with a lower phase change temperature is most desirable.

Figure 2:
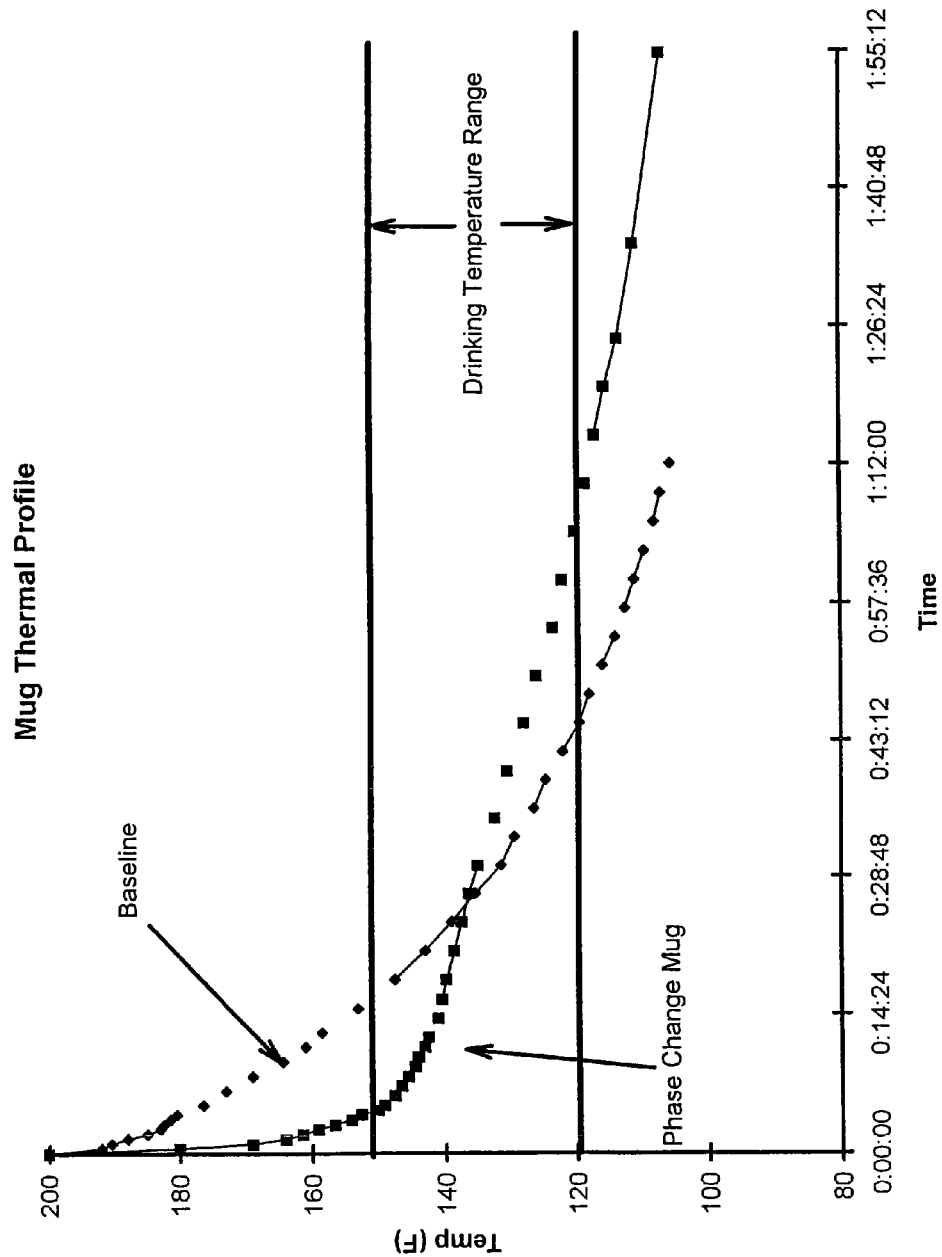
FIG. 2 is a graph depicting the temperature of a liquid in the subject drinking receptacle versus time, and showing for comparison purposes the heat loss characteristics of a baseline prior art drinking receptacle.

Referring now to FIG. 2, the thermal characteristics of the receptacle 10 adapted for hot beverages for adults are shown. A series of datapoints labeled as baseline indicate the temperature of a hot beverage poured into a typical prior art plastic coffee mug. The temperature of the beverage falls slowly but steadily to the upper limit of the warm range (labeled as Drinking Temperature Range) acceptable for human consumption, which in this example is approximately 150° F. The temperature of the beverage continues to fall at approximately the same rate until it falls below the lower limit of the warm range which in this example is approximately 120° F. Consequently, the beverage is only within the warm range or acceptable drinking temperature range for a short period of time.

The series of datapoints labeled as "Phase Change Mug" illustrate the thermal characteristics of a receptacle constructed according to the present invention. The datapoints indicate the temperature of a hot beverage poured into the receptacle versus time. The beverage cools very rapidly as the thermal energy of the beverage is absorbed by the phase change material. The beverage rapidly falls to the upper limit of the warm range and then the cooling rate slows. The beverage remains within the warm range for an extended period; more than an hour.

Figure 4:
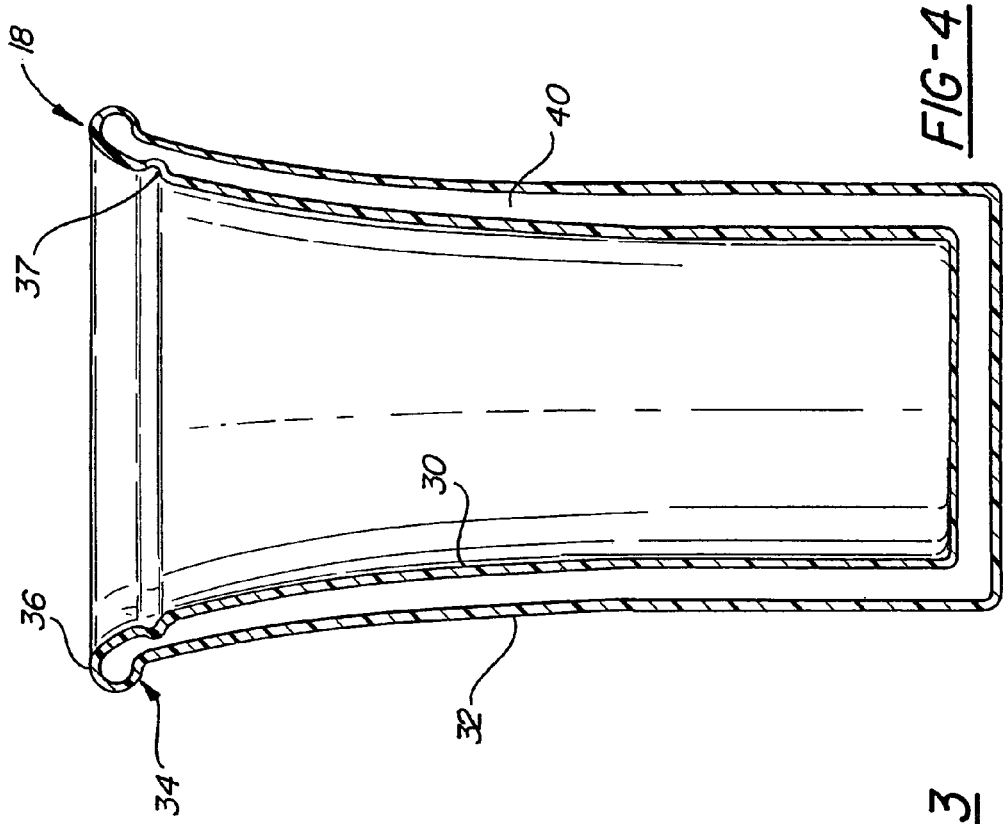
FIG. 4 is a cross sectional view as in FIG. 3 but showing an alternative vacuum insulated stainless steel outer shell for the subject drinking receptacle.
Figure 3:
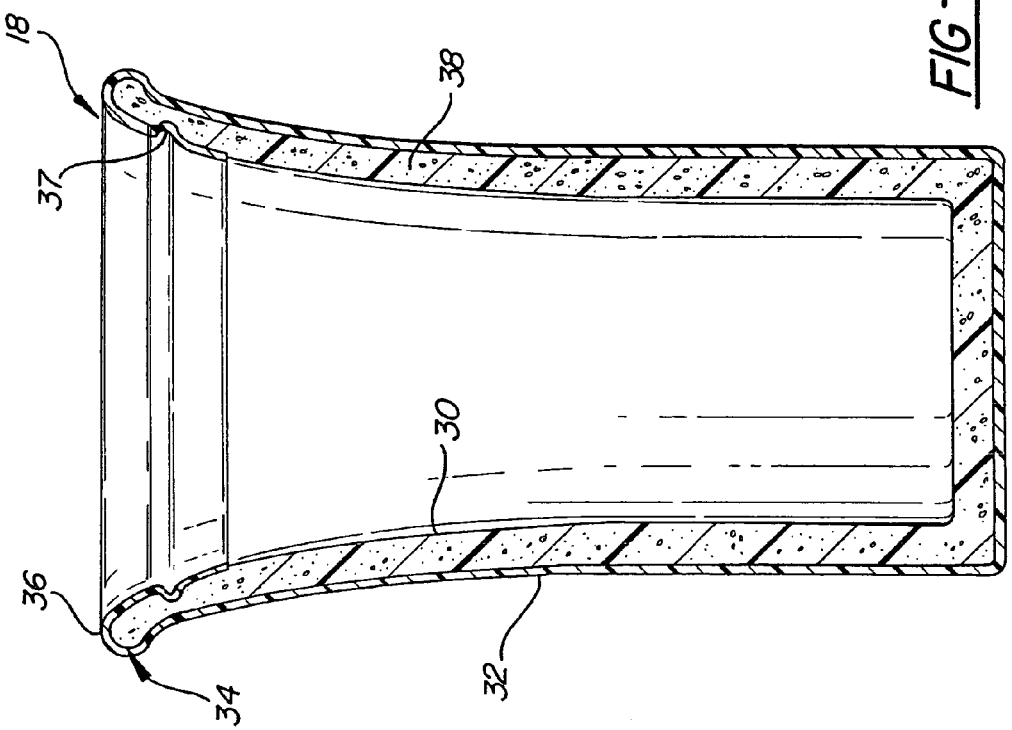
FIG. 3 is a cross sectional view a foam insulated plastic outer shell for the subject drinking receptacle.

Referring now to FIGS. 3 and 4, the outer shell is shown generally at 18. The shell 18 has an inner surface 30, an outer surface 32, and an upper edge 34 that terminates in a lip 36 for drinking from the receptacle. Two embodiments of the outer shell 18 are envisioned. In the preferred embodiment, shown in FIG. 3, the outer shell 18 has a rigid plastic outer surface 32 and a insulating foam layer 38. The outer surface 32 defines the outer contours of the receptacle 10. The inner surface 30 of the outer shell 18 is defined by the inner surface of the insulating foam layer 38. The insulating foam layer 38 can be made of a variety of insulating foams. Two acceptable foams are polyurethane foam and polystyrene foam.

A first alternative embodiment of the outer shell 18, as shown in FIG. 4, consists of a stainless steel outer surface 32 and inner surface 30 that form a totally sealed chamber 40. The chamber 40 is evacuated thereby creating a vacuum insulated outer shell 18. The two versions of the outer shell 18 have similar shapes but the stainless version is somewhat heavier and more costly to produce. A plastic insulated version of the complete receptacle assembly with a capacity of about 12 fluid ounces has a dry weight of about 12 oz. and the stainless version has a dry weight of about 16 oz.

The performance of the receptacle is greatly enhanced by the insulated outer shell 18. The insulation slows the loss of thermal energy from the phase change material thereby greatly extending the period that the beverage can be maintained within the warm range.

Referring back to FIG. 1, an additional feature of the present invention can be appreciated. The inner vessel 12 is recessed within the outer shell 18. The upper end 13 of the inner vessel 12 is located below the lip 36 of the outer shell 18. This prevents the lips of a consumer from contacting the inner vessel 12 when the consumer drinks from the receptacle 10. Because the inner vessel 12 is highly thermally conductive, the upper end 13 can be uncomfortably warm and therefore it most preferred that it is positioned so that it does not contact the consumer's lips. The amount that the upper end 13 should be recessed varies depending on the shape of the lip 36 and the overall design of the receptacle 10. With the shape illustrated in FIG. 1, it is preferred that the upper end 13 be spaced from the lip 36 by at least ⅛ inch and more preferably by at least ¼ inch. The upper end 13 of the inner vessel 12 seals to the inner surface 30 of the outer shell 18. The seal between the upper end 13 and the inner surface 30 must be sufficient to reliably retain the phase change material in chamber 20. Several sealing methods are available. Currently, it is preferred to form the inner surface 30 with a small recess 37 for the upper end 13 of the inner vessel 12 to snap into. A silicon sealant is applied to the recess 37 before the inner vessel 12 is inserted. A preformed silicon seal offers an alternative. It can be formed to fill a portion of the recess 37.

Figure 5:
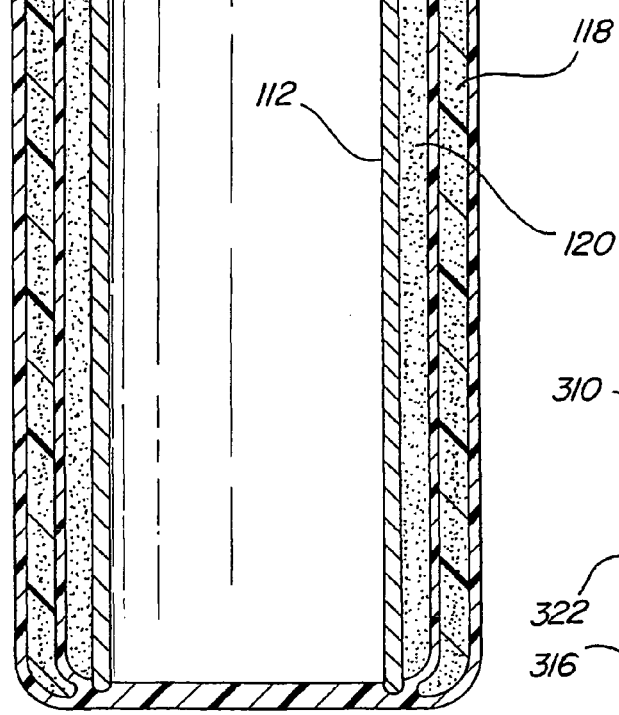
FIG. 5 is a cross sectional view of a baby bottle which is a first alternative embodiment of the present invention.

A baby bottle 110 incorporating a phase change material is a first alternative embodiment of the present invention as shown in FIG. 5. The baby bottle 110 includes a thermally conductive inner vessel 112 surrounded by an insulated outer shell 118. The outer shell 118 is spaced from the inner vessel 112 so as to form a chamber 120 which is at least partially filled with a phase change material. The acceptable temperature for liquid consumed by infants is significantly lower than the temperature desired by adults so a phase change material with a lower phase change temperature is used. The outer shell 118 can be plastic with a foam insulation layer or vacuum insulated stainless steel. It is desirable to minimize the weight of a baby bottle to allow an infant to support its weight unaided. Therefore, a lightweight plastic outer shell 118 with foam insulation is most preferred. The shell 118 may also incorporate a handle or other gripping means to allow an infant to more easily grasp the baby bottle 110. For maximum benefit from the phase change material, the infant beverage should be added to the bottle at a temperature above the warm range for infants so that excess thermal energy is absorbed by the phase change material. After a short period, the phase change material will have absorbed the excess thermal energy thus lowering the temperature of the beverage into the warm range for an infant. The excess thermal energy will serve to maintain the temperature of the beverage for an extended period. This is desirable if the infant is fussy and refuses to drink the entire contents of the bottle immediately. The temperature stabilizing effect of the phase change material has the additional benefit that parents will not have to worry about checking to see if the beverage is too hot. The bottle holds sufficient phase change material that a beverage could be added at boiling temperature. The bottle will cool the beverage to the acceptable range within a short period. Therefore, parents can be confident that as long as they wait a proscribed period, the beverage will be safe. The bottle may also incorporate a timing device or a temperature indicator to provide the parents with additional information.

Figure 6:
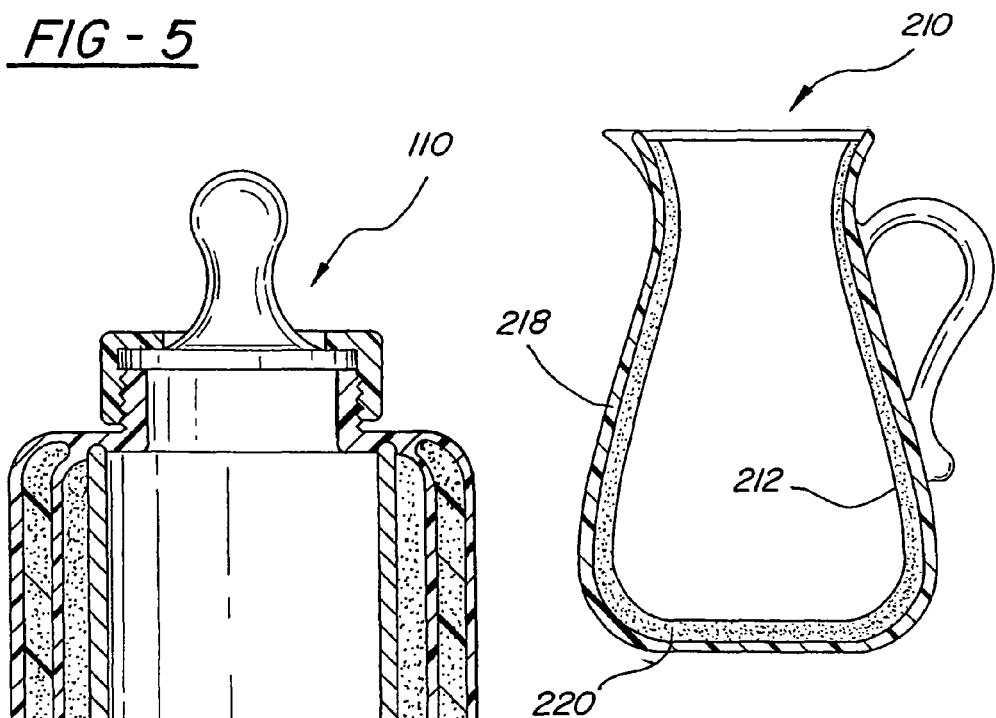
FIG. 6 is a cross sectional view of a carafe which is a second alternative embodiment of the present invention.

In FIG. 6, a second alternative embodiment, a carafe incorporating phase change material, is generally shown at 210. The carafe 210 includes a thermally conductive inner vessel 212 surrounded by an insulated outer shell 218. The shell 218 is spaced from the inner vessel 212 so as to form a chamber 220 which is at least partially filled with a phase change material. Since the carafe 210 will be used to hold hot beverages for pouring into mugs or cups, it is desirable to hold the beverage at a higher temperature than the maximum acceptable drinking temperature. When the beverage is poured from the carafe 210 into a mug, the mug will cool the beverage. Therefore, the pouring temperature should be higher than the desired drinking temperature. The carafe 210 will differ from the drinking receptacle 10 in that the carafe 210 will require significantly more phase change material to adequately absorb and store the thermal energy of the increased mass of hot beverage. Also, a phase change material with a higher phase change temperature is preferred.

Figure 7:
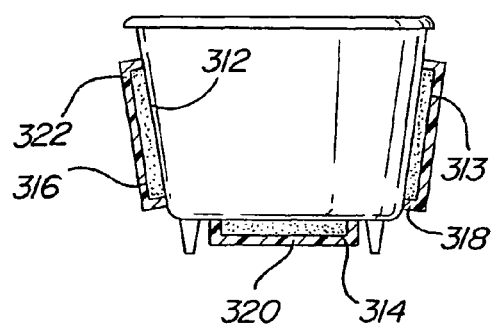
FIG. 7 is a cross sectional view of a bathing or soaking tub which is a third alternative embodiment of the present invention.

In FIG. 7, a third alternative embodiment, a bathtub incorporating phase change material, is generally shown at 310. The bathtub 310 includes a thermally conductive vessel 312. Attached to the exterior of the vessel 312 are boxes 313, 314, 316 which are at least partially filled with phase change material. Surrounding the boxes 313, 314, 316 are insulating layers 318, 320, 322. When hot bathing water is added to the bathtub 310, the phase change material absorbs thermal energy conducted into the boxes 313, 314, 316 from the bathing water. The bathing water quickly cools to an acceptable bathing temperature and then the phase change material starts conducting thermal energy back into the bathing water thereby maintaining its temperature. The boxes 313, 314, 316 are removably attached to the exterior of the vessel 312 so that boxes with different phase change materials can be substituted. This allows for changes in the sustained temperature of the bathing water as may be desirable when adults and children use the same bathtub. For example, when someone plans to use the tub, they would check to see what boxes 313, 314, 316 are connected. If a child is going to use the tub, the low temperature version of the boxes 313, 314, 316 should be connected. After confirming that the low temperature boxes are connected, an adult can fill the tub with hot water for the child. After a set period of time has passed, the temperature of the water in the tub will be acceptable and safe for the child. If later, the adult wishes to use the same tub for a higher temperature soak, they would change the boxes 313, 314, 316 to the higher temperature version, drain the tub if necessary, and refill the tub with hot water. It should be noted that the tub would require refilling with hot water if the boxes 313, 314, 316 were changed. The new hot water would then melt the phase change material in the new boxes 313, 314, 316 for the new bath. If the boxes 313, 314, 316 were changed without changing the water in the tub, the water in the tub would not have sufficient thermal energy to melt the phase change material in the boxes 313, 314, 316. Therefore, the phase change material could not provide the temperature maintenance function that it would ordinarily provide if it were melted by the excess thermal energy of fresh hot water.

Manufacturing of the Mug

The current design for the plastic version of the receptacle 10 shown in FIG. 1 calls for four parts which require expensive production equipment, three of which are injection molded, and one of which is a stamped aluminum part. The injection molded parts include the outer shell 18 of the receptacle, the handle 29, and an insulating lid. The stamped part is the aluminum inner vessel 12. Once these parts are produced, the remaining assembly can be done in a light manufacturing facility. The receptacle 10 is assembled in a series of four workstations, labeled as receiving, foam insulation injection, general assembly, and finally, packaging and shipping. At the insulation injection workstation, a plastic outer shell is snapped on to an inner mold and a portioned amount of urethane foam is injected into the cavity produced between the outer shell 18 and the inner mold. After this process is completed, the assembly is set aside to cure, generally in a heated area and for a period of two to three hours.

The general assembly station receives warmed, foam lined plastic outer shells 18 from the foaming station, adds the liquid phase change material, applies a bead of adhesive to the sealing point, and snaps the aluminum inner vessel inside the shell 18. This assembly operation must be performed "hot," that is, at a temperature that exceeds that of the melting point of the phase change material. This assembly temperature varies, but generally does not exceed 150° F. The handle 29 and lid are also added at this station to complete the assembly.

Alternative manufacturing technologies include the use of new expandable polymers such as expandable polypropylene. The use of these materials in producing plastic versions of the receptacle may reduce the fixed costs of injection molds and injection molding machines, as they will only require blow molds and stream blowing machines. These latter devices are approximately ¼ the cost of the injection molding equipment.

The manufacture of this stainless vacuum insulated version of the receptacle 10 varies only in the construction of the outer shell 18. The stainless outer shell 18 is composed of two pieces of stamped stainless steel. One different workstation is required for the fabrication of the vacuum jacketed stainless outer shell 18 from the stamped parts. This workstation is referred to as the welding and evacuation station, and in the four workstation sequence, it replaces the foaming station. As a result, the station sequence for the stainless versions is: receiving, welding and evacuation, assembly, and packaging.

The stainless steel version of the receptacle 10 requires two additional stampings, described as an inner and an outer half. The assembly of the stainless steel outer shell 18 includes pressing the inner and outer halves of this shell together. This operation leaves a seam at the top of the shell 18, and this seam is sealed by a TIG welding process, accomplished with the parts in a rotating holding jig.

Following the welding of the upper edge 34, the shell 18 is inverted, and a small tube attached by welding to the center of a depression in the bottom of the shell 18. This tube serves as the evacuation port. The small tube is connected to a vacuum source in a different section of the workstation, and left to evacuate. Once a sufficient vacuum has been reached, the shell 18 is leak checked. If the shell 18 passes this leak check, the evacuation tube, still under active pumping, is crimped, then welded off. Shells that fail the vacuum check must be inspected and their tops rewelded.

I claim:

1. A liquid receptacle for rapidly lowering the temperature of a liquid contained therein to a warm range suitable for human contact and maintaining the liquid in the warm range for an extended period of time, the receptacle having a drinking lip at the uppermost end, the receptacle comprising:
    an inner vessel having an open upper end and closed lower end and a wall connecting said upper end and said lower end;
    an insulated outer shell spaced from said inner vessel defining an interstitial chamber therebetween, the insulated outer shell having an open upper end and a closed lower end, the open upper end defining the drinking lip, the drinking lip being integrally formed with the lower end of the insulated outer shell; and
    a phase change material disposed within said chamber for regeneratively absorbing thermal energy from the liquid and then releasing the thermal energy to the liquid to maintain the temperature of the liquid;
    wherein the inner vessel is sized such that the inner vessel is received through the open upper end and past the drinking lip of the insulated outer shell during an assembly operation.

2. A receptacle according to claim 1 wherein said outer shell has an inner surface and an outer surface; and
    said upper end of said inner vessel is in sealing engagement with said inner surface of said outer wall.

3. A receptacle according to claim 1 wherein said outer shell comprises an inner layer and an outer layer with an evacuated void therebetween for vacuum insulating said outer shell.

4. A receptacle according to claim 1 wherein said outer shell comprises a layer of insulating foam.

5. A liquid receptacle in accordance with claim 1, wherein the wall of the inner vessel has an outward taper such that the upper end has a width greater than the lower end.

6. A liquid receptacle in accordance with claim 5, wherein the insulated outer shell has an inner surface extending from the closed lower end to the open upper end, the inner surface being tapered outwardly such that the upper end has a width greater than the lower end, the lower end of the inner vessel having a width less than the width of the upper end of the inner surface of the outer shell.

7. A liquid receptacle in accordance with claim 1, wherein the inner vessel is sized such that the entirety of the inner vessel is received through the open upper end and past the drinking lip of the insulated outer shell during an assembly operation, such that the entirety of the inner vessel is disposed between the open upper and closed lower end of the insulated outer shell.

8. A method of making a liquid receptacle for rapidly lowering the temperature of a liquid contained therein to a warm range suitable for human contact and maintaining the liquid in the warm range for an extended period of time, said method comprising:
    providing an inner vessel having an open upper end and closed lower end and a wall connecting said upper end and said lower end;
    providing an insulated outer shell having an open upper end and a closed lower end, the upper end of the insulated outer shell defining a drinking lip;
    inserting the entirety of the inner vessel through the open upper end of the insulated outer shell and past the drinking lip such that the entirety of the inner vessel is spaced below the open upper end and is disposed between the open upper end and closed lower end of the insulated outer shell and an interstitial chamber is defined between the inner vessel and insulated outer shell; and
    disposing a phase change material in the chamber, the phase change material operative to regeneratively absorb thermal energy from a liquid in the inner vessel and then release the thermal energy to the liquid to maintain the temperature of the liquid.

9. The method of claim 8, wherein the step of providing the inner vessel comprises providing an inner vessel with the wall having an outward taper such that the upper end has a width greater than the lower end.

10. The method of claim 9, wherein the step of providing the insulated outer shell comprises providing an outer shell having an inner surface extending from the closed lower end to the open upper end, the inner surface being tapered outwardly such that the upper end has a width greater than the lower end, the lower end of the inner vessel having a width less than the width of the upper end of the inner surface of the outer shell.

11. The method of claim 8, wherein the step of disposing the phase change material in the chamber comprises disposing the phase change material in the insulated outer shell prior to inserting the closed lower end of the inner vessel through the open upper end of the insulated outer shell.

* * * * *